US012622264B2

(12) United States Patent
Leng

(10) Patent No.: US 12,622,264 B2
(45) Date of Patent: May 5, 2026

(54) THREE-DIMENSIONAL METAL-INSULATOR-METAL (MIM) CAPACITORS AND TRENCHES

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 419 days.

(21) Appl. No.: 18/104,372

(22) Filed: Feb. 1, 2023

(65) Prior Publication Data

US 2024/0170390 A1 May 23, 2024

Related U.S. Application Data

(60) Provisional application No. 63/426,292, filed on Nov. 17, 2022.

(51) Int. Cl.
*H10W 20/40* (2026.01)
*H10D 1/00* (2025.01)
*H10D 1/68* (2025.01)

(52) U.S. Cl.
CPC .......... *H10W 20/496* (2026.01); *H10D 1/042* (2025.01); *H10D 1/696* (2025.01); *H10D 1/716* (2025.01)

(58) Field of Classification Search
CPC ........ H10D 1/042; H10D 1/696; H10D 1/716; H10D 1/692; H01L 23/5223; H10W 20/496
See application file for complete search history.

(56) References Cited

U.S. PATENT DOCUMENTS

| | | | |
|---|---|---|---|
| 9,627,468 B2 | 4/2017 | Che et al. | |
| 2002/0163029 A1* | 11/2002 | Dirnecker | H10D 1/68 |
| | | | 257/E21.582 |
| 2004/0201053 A1* | 10/2004 | Tu | H10D 1/716 |
| | | | 257/296 |

(Continued)

FOREIGN PATENT DOCUMENTS

| | | | | |
|---|---|---|---|---|
| KR | 20060061471 A | 6/2006 | | H01L 27/108 |
| WO | 2022/220867 A1 | 10/2022 | | H01L 21/768 |

OTHER PUBLICATIONS

International Search Report and Written Opinion, Application No. PCT/US2023/016506, 13 pages, Jul. 28, 2023.

*Primary Examiner* — Omar F Mojaddedi
(74) *Attorney, Agent, or Firm* — SLAYDEN GRUBERT BEARD PLLC

(57) ABSTRACT

A method for making a three dimensional (3D) Metal-Insulator-Metal (MIM) capacitor and trenches by etching a dielectric layer to form a via or contact hole, a tub, and a trench in the dielectric layer; depositing conformal metal in the via or contact hole, the tub, and the trench, wherein the deposited conformal metal forms bottom and sidewall portions of a 3D bottom electrode of a metal-insulator-metal (MIM) capacitor in the tub, and wherein the deposited conformal metal forms a via or contact in the via or contact hole; removing conformal metal and at least a portion of the dielectric layer from a lip of the tub; depositing an insulator layer on the 3D bottom electrode to form an insulator layer of the MIM capacitor; and depositing a metal layer on the insulator layer to form a top electrode of the MIM capacitor.

20 Claims, 19 Drawing Sheets

(56)               References Cited

U.S. PATENT DOCUMENTS

| | | | |
|---|---|---|---|
| 2005/0087879 A1* | 4/2005 | Won | H10D 84/212 |
| | | | 257/E21.582 |
| 2006/0024899 A1* | 2/2006 | Crenshaw | H10W 20/496 |
| | | | 257/E21.019 |
| 2017/0104056 A1* | 4/2017 | See | H10D 1/692 |
| 2022/0069069 A1 | 3/2022 | Leng et al. | |

* cited by examiner

THREE-DIMENSIONAL METAL-INSULATOR-METAL (MIM) CAPACITORS AND TRENCHES

RELATED PATENT APPLICATIONS

This application claims priority to commonly owned U.S. Patent Application No. 63/426,292 filed Nov. 17, 2022, the entire contents of which are hereby incorporated by reference for all purposes.

TECHNICAL FIELD

The present disclosure relates to metal-insulator-metal (MIM) capacitors in, for example, analog/mixed signal/RF-CMOS circuits, and more particularly, to a three-dimensional (3D) MIM capacitor.

BACKGROUND

A metal-insulator-metal (MIM) capacitor is a capacitor constructed with a metal top electrode, a metal bottom electrode, and an insulator (dielectric) sandwiched between the two metal electrodes. The electrodes may be in the form of plates.

MIM capacitors are important components in many electrical circuits, for example many analog, mixed-signal, and radio-frequency complementary metal-oxide semiconductors (RF CMOS) circuits. MIM capacitors may offer better performance over other alternatives due to lower resistance, better matching, and better Signal/Noise ratio. For example, MIM capacitors may offer better performance than POP (Poly-Oxide-Poly) capacitors and MOM (Metal-Oxide-Metal Lateral Flux) capacitor.

MIM capacitors are typically provided built just below the top metal layer, for example, using the existing Top-1 Metal layer as the bottom electrode, constructing a top electrode with a different metal (e.g., Titanium or Titanium Nitride (Ti/TiN), Tantalum or Tantalum Nitride (Ta/TaN), or Tungsten (W)), and connecting an overlying Top Metal layer to the top and bottom electrodes of the capacitor through respective interconnect structures. The top electrode typically has a higher resistance than the bottom electrode, e.g., because the top electrode may be limited by thickness constraints and the material of choice for integration, thus limiting the performance of conventional MIM capacitors.

Conventional MIM capacitors can be built either with aluminum interconnect structures or with copper interconnect structures. The MIM capacitors include an insulator layer formed between a bottom electrode (typically using one existing interconnect layer, either aluminum or copper) and a metal top electrode (typically an additional metal layer inserted between two existing interconnect metal layers, with metal such as Ti, TiN, Ta, or TaN). The metal bottom electrode and metal top electrode are each connected to a respective connection pad by one or more vias. The insulator layer may be a SiN layer having a thickness of about 500 Å, for example.

As used herein, a "via" is a connection between two metal layers, and a "contact" is a connection between a poly/active layer and M1. A contact or via may be formed by plugging or otherwise depositing a conformal conductive material (e.g., tungsten) in a via or contact hole having a small diameter or width, e.g., a diameter or width below 1 µm, and thus having a relatively large resistance, e.g., a resistance of at least 1 ohm per via. For example, conventional vias or contacts typically have a small diameter in the range of 0.1

µm to 0.5 µm, and may have a resistance of about 10 ohms/via, for example, especially for vias or contacts formed from tungsten or other highly resistive material. Thus, conventional MIM capacitors often include multiple vias or contacts (e.g., multiple vias or contacts between the top electrode and top electrode pad and/or multiple vias or contacts between the bottom electrode and bottom electrode pad) to reduce the overall resistance to some extent. As used herein, a "via" or "contact" in the context of an MIM capacitor refers to a via or contact extending from a capacitor electrode (top electrode or bottom electrode) to an overlying conductive pad.

In addition, MIM capacitors are typically expensive to build, e.g., as compared with other certain types of capacitors. For example, MIM capacitors typically require additional mask layers and many additional process steps, as compared with POP capacitors and MOM capacitors. MIM capacitors also typically use relatively large areas of silicon, resulting in inefficient area usage, particularly with large MIM capacitors.

Further, in a conventional MIM capacitor, the top electrode is thin and thus provides a high series resistance, as the vertical thickness of the top electrode is limited by the vertical distance between the adjacent metal layers in which the MIM capacitor is formed, (e.g., top metal layer and top-1 metal layer).

As described above, a conventional MIM capacitor may be constructed with a top electrode, a bottom electrode, and an insulator (dielectric) sandwiched in-between, hence a Metal-Insulator-Metal (MIM) capacitor. A MIM capacitor includes an insulator layer formed between a bottom electrode (Mx Metal layer) and a metal top electrode. The bottom electrode and metal top electrode are each connected to a respective pad (Mx+1 top metal layer) by one or more vias. Typically, MIM capacitors may be built with an additional mask layer to define the top electrode, and therefore, may be more expensive to manufacture compared to metal-oxide-metal (MOM) and Poly-Oxide-Poly (POP) capacitors. If the bottom electrode is made of aluminum, it can be rough and have hillocks or protrusions (bumpy surface), which cause low and uncontrolled breakdown voltage. A hillock is a protrusion large enough to substantially reduce the breakdown voltage of the MIM capacitor.

There is a need for MIM capacitors that can be manufactured at lower cost, particularly without the added mask layer, and with improved spatial density, and/or with improved breakdown voltage by having fewer hillocks.

SUMMARY OF THE INVENTION

Aspects provide three-dimensional MIM capacitors which may be built concurrently with interconnect structures, and without any additional masks added to the process, and with improved spatial density, and/or with improved breakdown voltage by having fewer hillocks. An aspect provides a process that builds a 3D MIM capacitor without an additional mask by etching a trench in a dielectric layer so a first chemical mechanical polishing (CMP) of the entire integrated circuit structure dishes and erodes electrode metal adjacent the trench to a depth sufficient build a 3D MIM capacitor below the upper surface of the dielectric layer across the rest of the integrated circuit structure. With the 3D MIM capacitor lower than the upper surface of the dielectric layer, a second CMP polishes away dielectric layer material from the rest of the integrated circuit structure without damaging the 3D MIM capacitor.

According to an aspect, there is provided a method comprising: etching a dielectric layer to form a via or contact hole, a tub, and a trench in the dielectric layer; depositing a conformal metal in the via or contact hole, the tub, and the trench, wherein the deposited conformal metal forms bottom and sidewall portions of a three-dimensional bottom electrode of a metal-insulator-metal (MIM) capacitor in the tub, and wherein the deposited conformal metal forms a via or contact in the via or contact hole; removing conformal metal and at least a portion of the dielectric layer from a lip of the tub; depositing an insulator material on the bottom electrode to form an insulator layer of the MIM capacitor; and depositing a metal layer on the insulator layer to form a top electrode of the MIM capacitor.

An aspect provides a device comprising: a three-dimensional metal-insulator-metal (MIM) capacitor comprising: a three-dimensional bottom electrode; a top electrode; and an insulator layer between the top electrode and the bottom electrode; a Mx metal layer or silicided poly layer electrically connected to the three-dimensional bottom electrode; an Mx+1 metal layer or M1 metal layer comprising the top electrode; a metal pad electrically connected to the Mx metal layer or silicided poly layer through a via or contact, respectively, wherein a height of the three-dimensional bottom electrode is smaller than a height of the via or contact.

According to another aspect, there is provided a device comprising: a three-dimensional metal-insulator-metal (MIM) capacitor comprising: a three-dimensional bottom electrode; a top electrode; and an insulator layer between the top electrode and the bottom electrode; a Mx metal layer or silicided poly layer electrically connected to the three-dimensional bottom electrode; an Mx+1 metal layer or M1 metal layer comprising the top electrode; and a metal pad electrically connected to the Mx metal layer or silicided poly layer through a trench connection, respectively, wherein a height of the three-dimensional bottom electrode is smaller than a height of the trench connection.

BRIEF DESCRIPTION OF THE DRAWINGS

The figures illustrate examples of three-dimensional MIM capacitors built concurrently with interconnect structures, and without a mask added to the process.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DESCRIPTION

Three-dimensional MIM capacitors may be built concurrently with interconnect structures, and without a mask added to the process, and with improved spatial density, and/or with improved breakdown voltage by having fewer hillocks.

Figure 1:
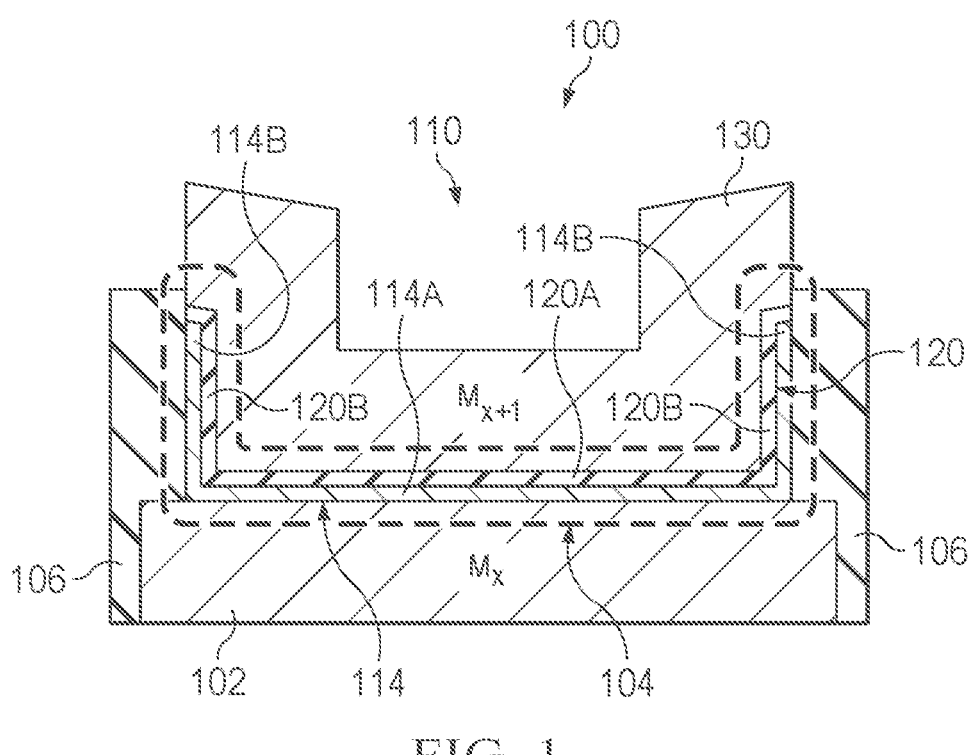
FIG. 1 shows a cross-sectional, side view of a three-dimensional MIM capacitor.

FIG. 1 shows a cross-sectional, side view of an integrated circuit structure 100 having a three-dimensional (3D) MIM capacitor 104. The 3D MIM capacitor 104 may have a 3D electrode 114 that includes (i) a bottom portion 114A formed on an Mx metal layer 102 and (ii) vertically-extending sidewall portions 114B extending upwardly from the Mx metal layer 102 and defined by a tub 110 in a dielectric layer 106. A tub 110 is a recess in the dielectric layer 106 in which a 3D MIM capacitor 104 may be built. An insulator layer 120 is formed on the 3D electrode 114 and includes (i) a bottom portion 120A formed on the bottom portion 114A of the 3D electrode 114 and (ii) sidewall portions 120B covering the vertically-extending sidewall portions 114B of the 3D electrode 114. The insulator layer 120 may be a conformal layer. A top electrode 130 may be in a Mx+1 layer.

Figure 2A:
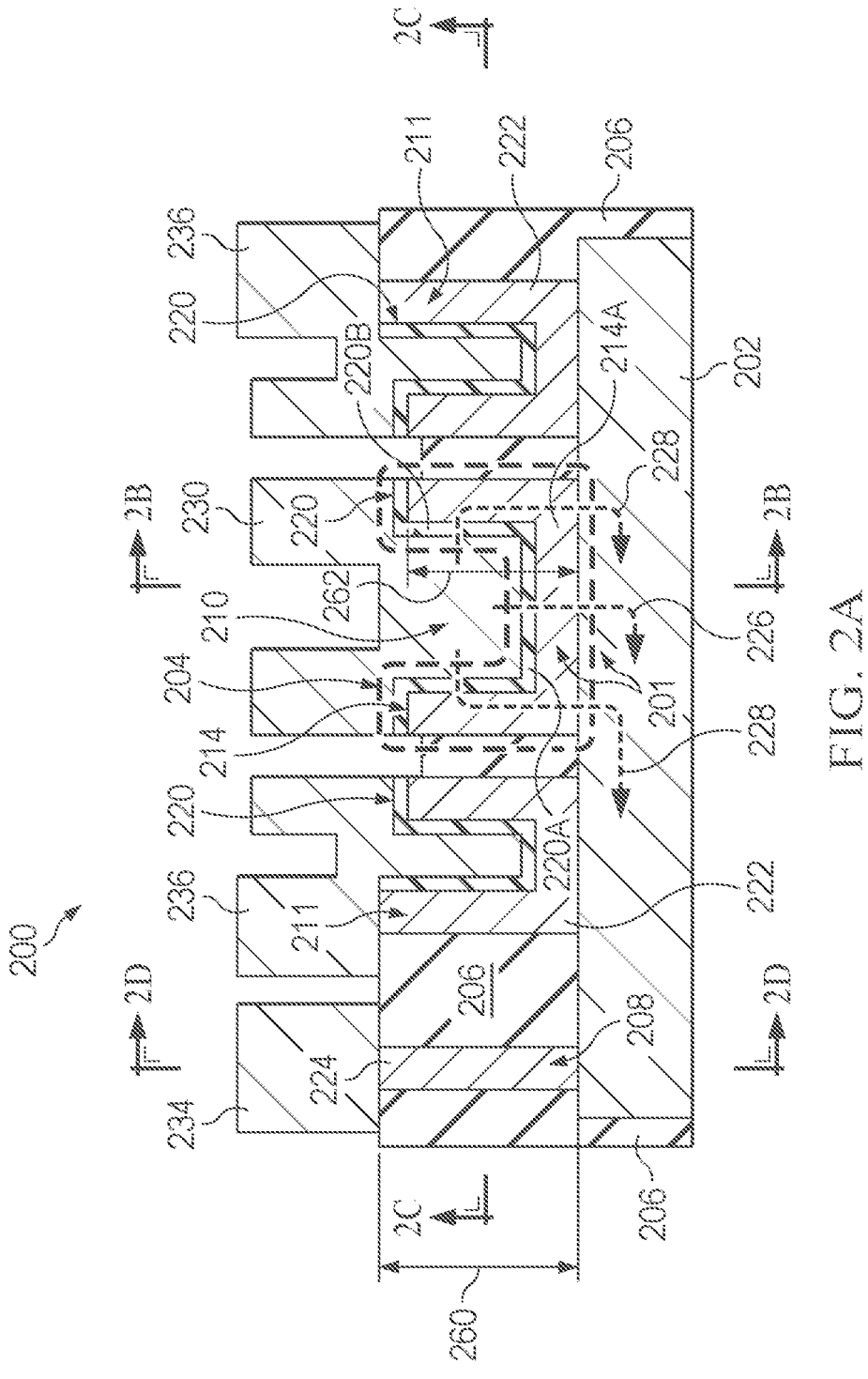
FIGS. 2A-2D show cross-sectional views of a three-dimensional MIM capacitor built concurrently with a via or contact, and without a mask added to the process, wherein a height of the three-dimensional bottom electrode is shorter than a height of the via or contact.
Figure 2B:
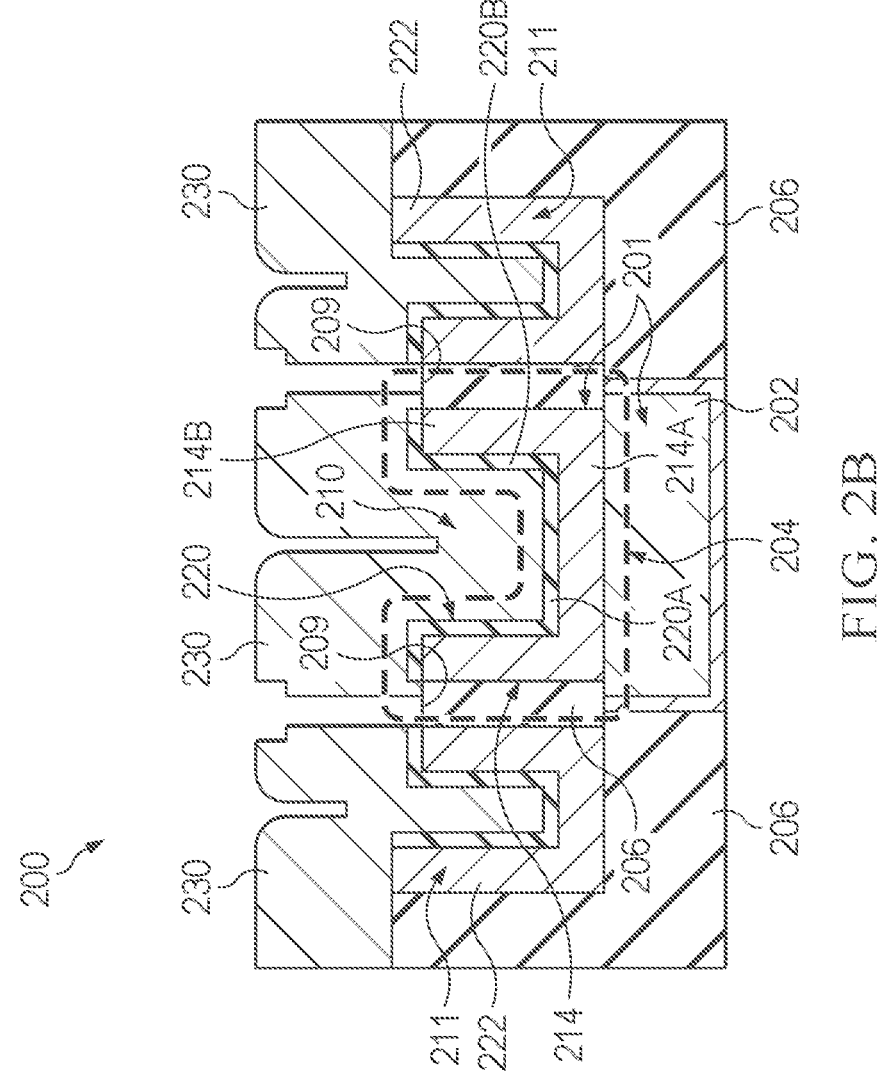
Figure 2C:
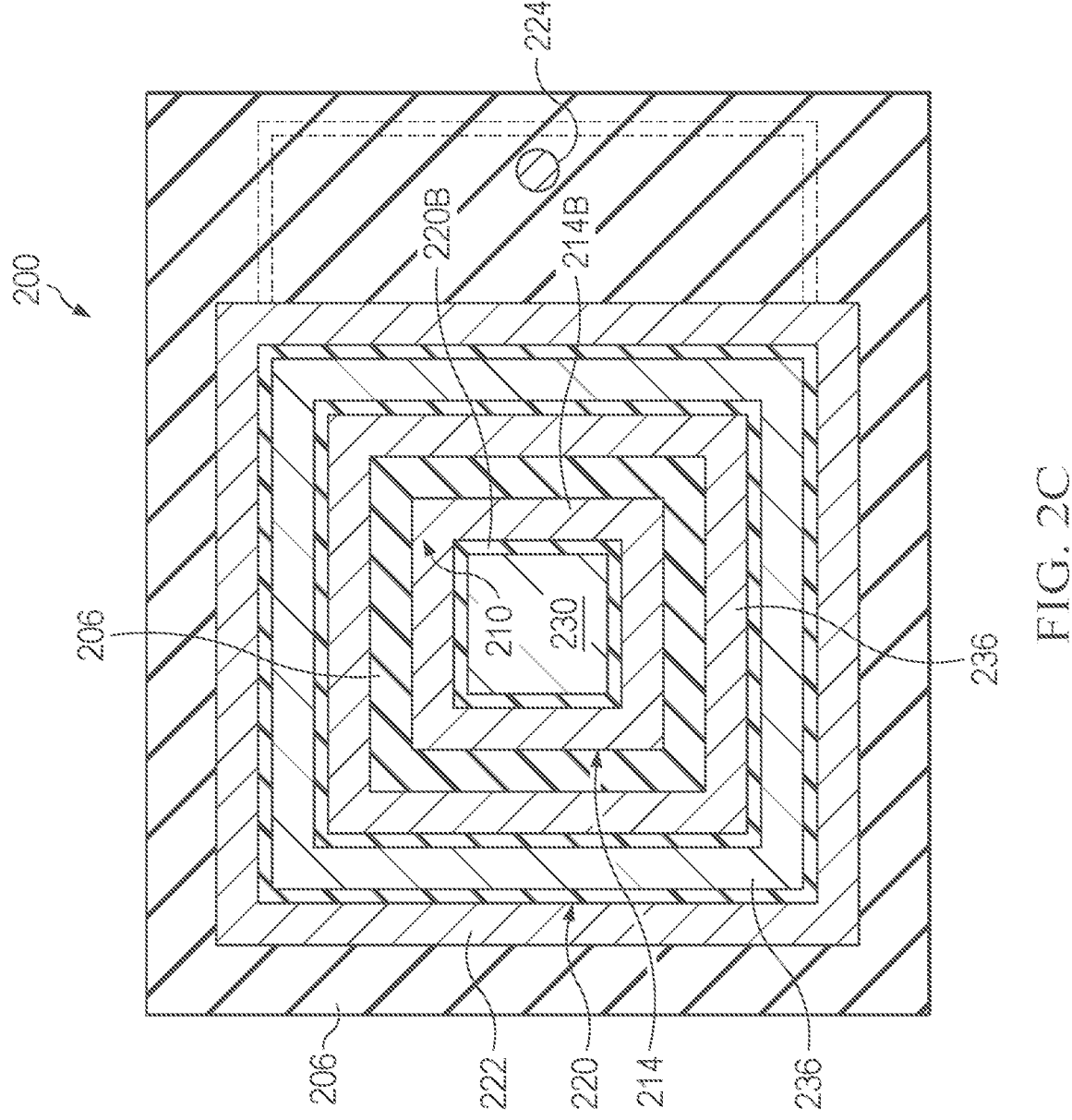
Figure 2D:
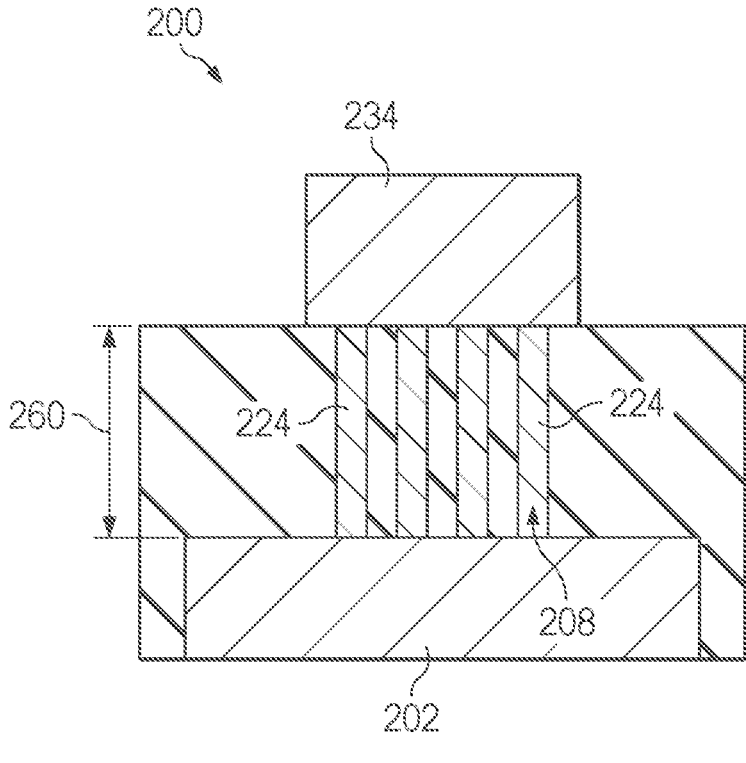

FIGS. 2A-2D collectively show an example of an integrated circuit structure 200 having a 3D MIM capacitor 204. In particular, FIG. 2A shows a first cross-sectional side view, FIG. 2B shows a second cross-sectional side view taken through cut line 2B-2B shown in FIG. 2A, and FIG. 2C shows a top-down cross-sectional view taken through cut line 2C-2C shown in FIG. 2A. FIG. 2D shows a third cross-sectional side view taken through cut line 2D-2D, shown in FIG. 2A. As shown in FIGS. 2A-2D collectively, a bottom electrode 201 of the MIM capacitor 204 includes (a) a horizontally-extending Mx metal layer 202 and (b) a 3D electrode 214 formed on the Mx metal layer 202 and having (i) a bottom portion 214A formed on the Mx metal layer 202 and (ii) vertically-extending sidewall portions 214B extending upwardly from the Mx metal layer 202. In some examples, the Mx metal layer 202 may be formed in a copper interconnect layer, e.g., a top copper interconnect layer, referred to herein as the "Cu MTOP layer." Mx metal layer 202 may be formed over a barrier layer, e.g., a Ta/TaN barrier layer, not shown. The 3D electrode 214 may be formed in a tub 210 formed in a dielectric layer 206. The dielectric layer 206 may be Inter Layer Dielectrics (ILD) or Poly-Metal Dielectrics (PMD). The tub 210 may be a wide "tub," as discussed herein. The 3D electrode 214 may be formed from a conformal material, such as tungsten (W) or other suitable material, e.g., formed from the same material and concurrently with conductive via(s) 224, as discussed below. 3D electrode 214 is electrically coupled with Mx metal layer 202. The three-dimensional 3D electrode 214 may be cup-shape or any other 3D geometry.

3D MIM capacitor 204 may be referred to as a "single-layer" MIM capacitor because it uses only a single metal interconnect layer to form the capacitor 204. An insulator layer 220 is formed in the 3D electrode 214 and includes (i) a bottom portion 220A formed on the bottom portion 214A of the 3D electrode 214 and (ii) sidewall portions 220B covering the vertically-extending sidewall portions 214B of the 3D electrode 214. The insulator layer 220 may be a conformal layer, formed from SiN or other suitable dielectric material.

A top electrode 230 is formed over the insulator layer 220 and extending down into a three-dimensional, for example cup-shaped, tub formed by insulator layer 220, particularly defined by a top surface of bottom portion 220A and surfaces of sidewall portions 220B. See FIG. 2B. As shown, the 3D electrode 214 of bottom electrode 201 substantially increases the area of capacitance between the top electrode 230 and the bottom electrode 201, through both the horizontally-extending bottom portion 220A and the vertically-extending sidewall portions 220B of the insulator layer 220. Top electrode 230 may be formed from aluminum or other suitable material.

The bottom electrode 201 may also be conductively connected to a top-side bond pad 234, e.g., by at least one via 224 connecting the bond pad 234 to the Mx metal layer 202. In some embodiments, the tub 210 in which the 3D electrode 214 is formed may be formed concurrently with at least one narrow via hole 208 in which the at least one via(s) 224 is/are formed. The tub 210 and via hole(s) 208 may be filled concurrently, e.g., by a conformal metal deposition, to form the 3D electrode 214 and via(s) 224.

As shown in FIG. 2C, the tub 210 in which the 3D electrode 214 is formed (followed by the insulator layer 220 and top electrode 230) may have a square shape from a top-down view. In other embodiments, the tub may have a square shape with rounded corners, rectangular shape, rectangular shape with rounded corners, circular shape, oval shape, cross shape, or any other suitable shape.

As shown in FIG. 2A, the three-dimensional structure of 3D MIM capacitor 204 defines not only a displacement current path through the bottom portion 220A of the insulator layer 220, indicated generally by dashed arrows 226, but also displacement current paths through the vertically-extending sidewall portions 220B of the insulator layer 220, indicated generally by dashed arrows 228. Each insulator layer sidewall 220B provides an additional area of capacitive coupling between the top electrode 230 and bottom electrode 201. The bottom portion 220A of the insulator layer 220 effectively defines a capacitor, with the top and bottom electrodes extending horizontally, and each insulator layer sidewall 220B effectively defines an additional capacitor, with the top and bottom electrodes extending vertically. Thus, the three-dimensional structure of 3D MIM capacitor 204 thereby defines a substantially increased area of capacitive coupling between the top electrode 230 and bottom electrode 201, e.g., as compared with a conventional MIM capacitor. The three-dimensional bottom electrode 214 has a height 262 that is smaller than a height 260 of the via 224, with the respective heights 260, 262 defined from a common plane at a top surface of Mx metal layer 202. The difference between the height 262 of the three-dimensional bottom electrode 214 and the height 260 of the via 224 is between about 0.1 μm and about 0.5 μm. As illustrated in FIG. 2A, the height of the via 224 is the same as the height of a trench connection 222.

FIGS. 2A-2D also show the 3D MIM capacitor 204 formed in the tub 210 may be surrounded by trench connections 222 formed in trenches 211 (single or multiple, continuous or segmented). A tub 210 is a recess in the dielectric layer 206 in which a 3D MIM capacitor 204 may be built. A trench 211 is a recess in the dielectric layer 206 near the tub 210 that facilitates removal of material at the lip of the tub 210. The trenches 211 may selectively form a local pattern density and create a recess of a dielectric tub lip 209 (see FIG. 2B) in 3D MIM capacitor 204. A conformal metal cup in the trenches 211 may also optionally serve to form trench connections 222, which provides an optional additional connection with the bottom electrode 201, besides via(s) 224 (via-x) and may be electrically coupled to an optional bottom-side bond pad 236.

The example 3D MIM capacitor 204 shown in FIGS. 2A-2D may have a bottom electrode made of a conformal metal and be hillock-free. The MIM capacitor may be built between Mx and Mx+1, or between salicided poly and M1. The top electrode 230 and top-side bond pad 234 may be in the Mx+1 layer.

The structure of 3D MIM capacitor 204 may be different than other MIM structures. A three-dimensional MIM according to the present examples may be concurrently built in the same layer as the vias or contacts. A via may be built in an Inter-Layer Dielectrics (ILD) layer between two layers of metal (Mx and Mx+1), or a contact may be built in a Poly-Metal Dielectrics (PMD) layer between silicided poly and M1. The MIM capacitor according to the present examples may be built between two layers of metal (Mx and Mx+1), or between silicided poly and M1. A trench surrounding a conformal metal tub may be used to engineer the local pattern density, and also optionally connect to the bottom electrode. The bottom electrode may be formed of a conformal metal. The bottom electrode may also be formed of a refractory metal, such as tungsten or cobalt, and be hillock-free with consistent breakdown voltage. Refractory metals are a class of metals that are highly resistant to heat and wear. In this disclosure, they are metals used in a semiconductor process (e.g., Ti, TiN, W, Ta, TaN, or Co) with a melting point temperature significantly higher than 400 C. Because backend-of-the-line (BEOL) semiconductor processes are controlled to be below ~400 C, refractory metals may not generate hillocks from thermal stress relief, and may therefore provide capacitors with high and consistent breakdown voltage. A hillock free surface may have a tighter breakdown voltage distribution because it has no outliers and may be the result of using refractory metals. Alternatively, aluminum Al can be used with high radio-frequency RF power during deposition (a so called smooth metal) with large grain size and reduced film roughness.

Aspects may be used in any wafer FAB. The integration of the process described herein may be compatible with foundry CMOS process flow.

Figure 3A:
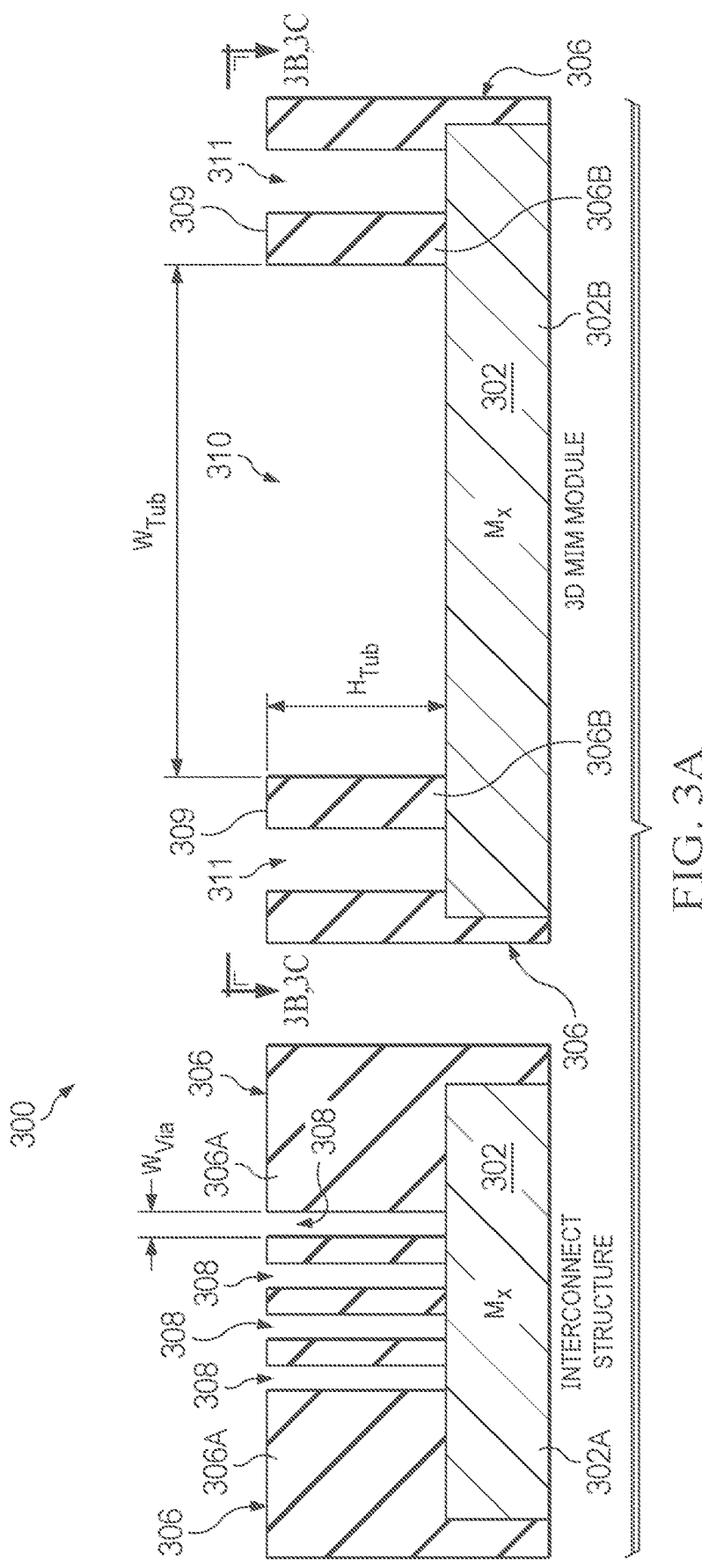
FIG. 3A shows cross-sectional side views of a wafer upon which a three-dimensional MIM capacitor may be made in a dielectric layer having vias, a tub, and a trench.
Figure 3B:
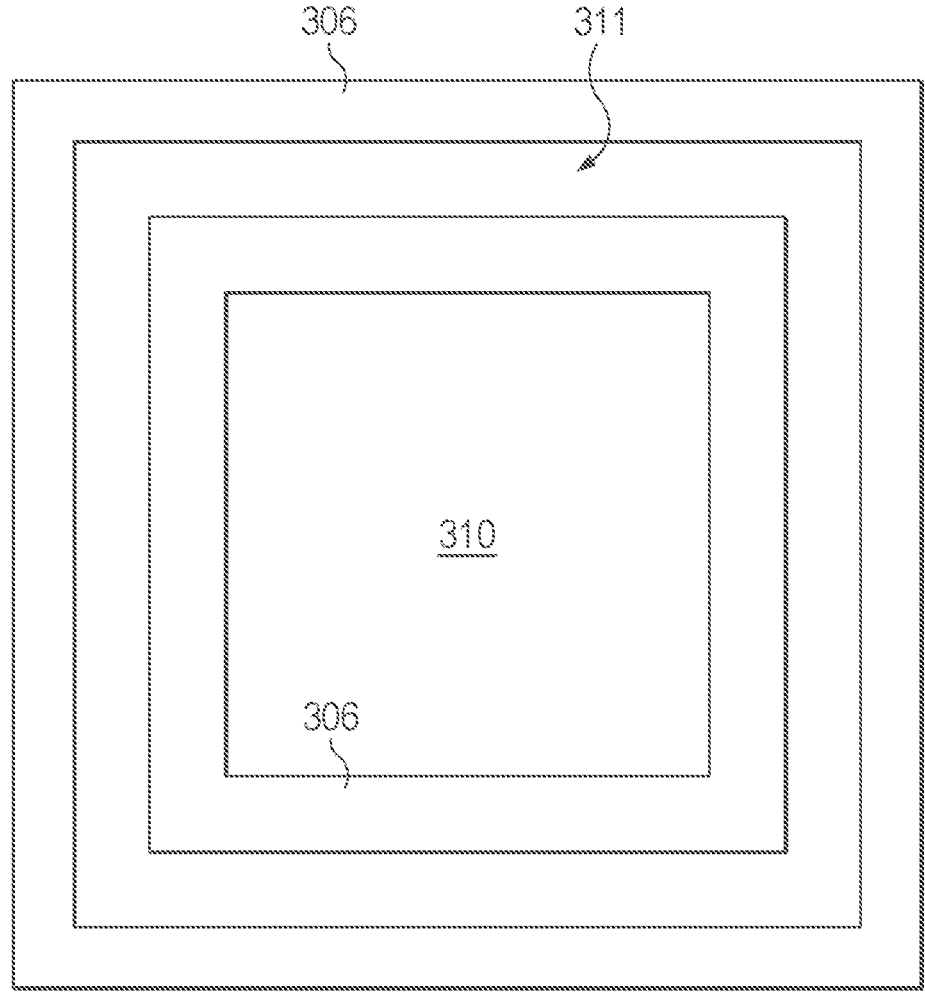
FIG. 3B shows a top view of the wafer of FIG. 3A, wherein the trench is a continuous trench surrounding the tub.
Figure 3C:
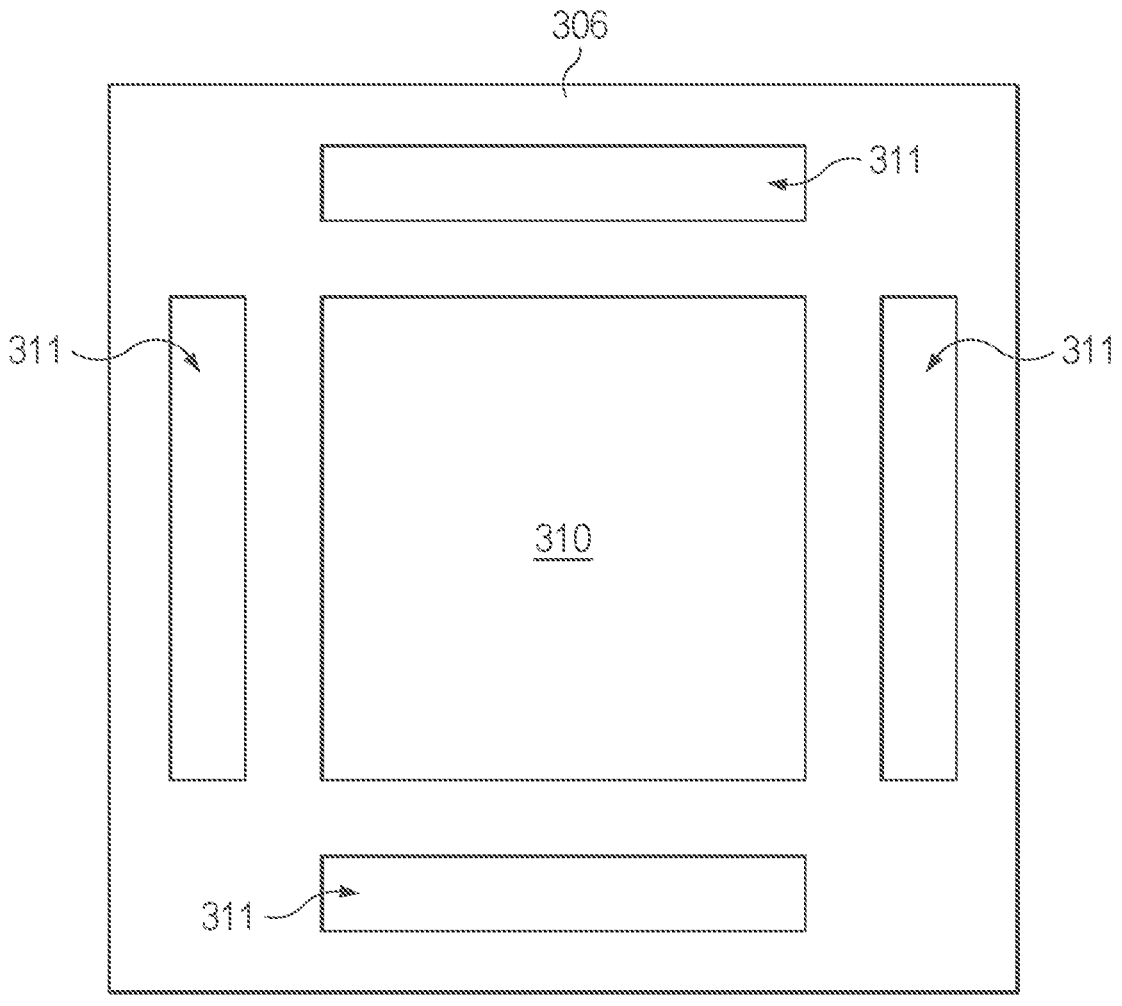
FIG. 3C shows a top view of the wafer of FIG. 3A, wherein the trench may be segmented, for example, four trenches in four directions surrounding the tub, but not connected.
Figure 3D:
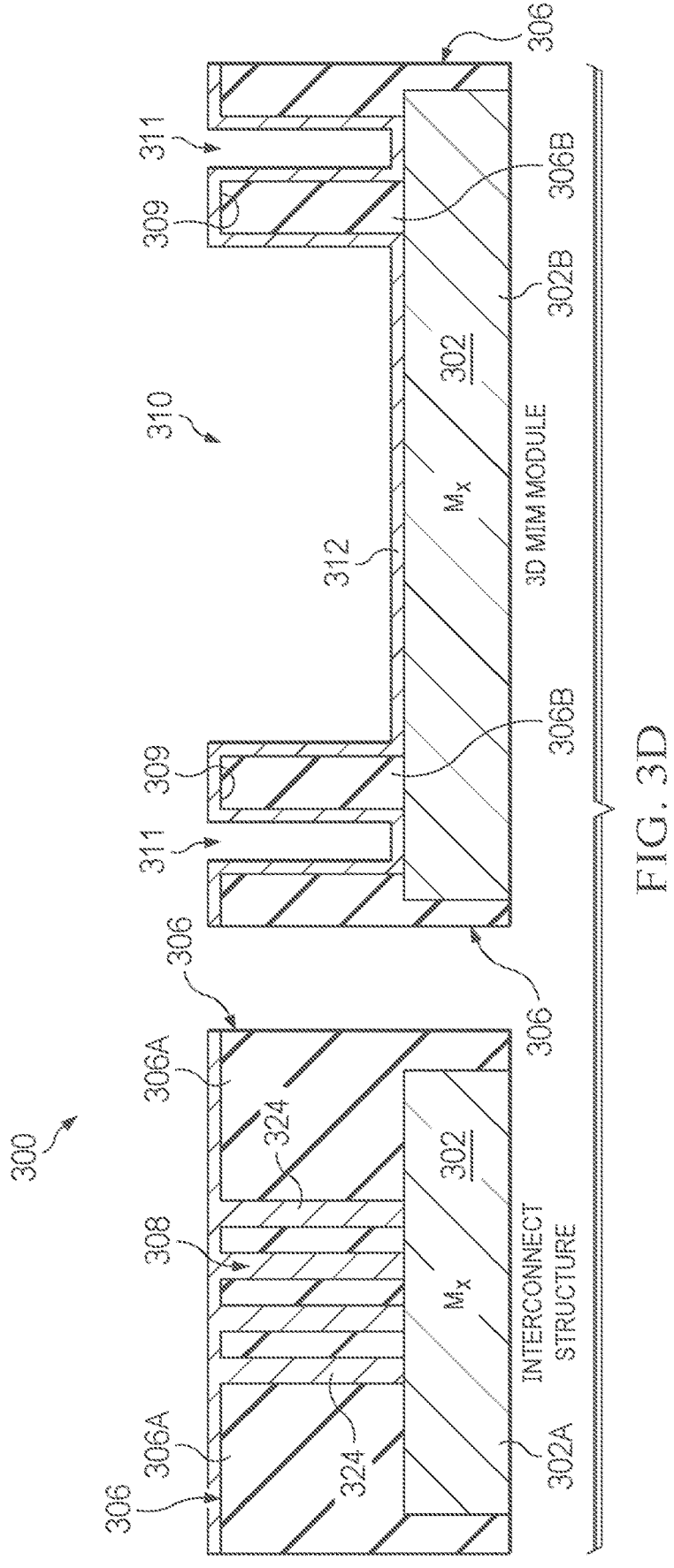
FIG. 3D shows cross-sectional side views of the wafer of FIG. 3A after application of a conformal metal layer (for example, tungsten W) to the wafer to make a three-dimensional MIM capacitor.
Figure 3E:
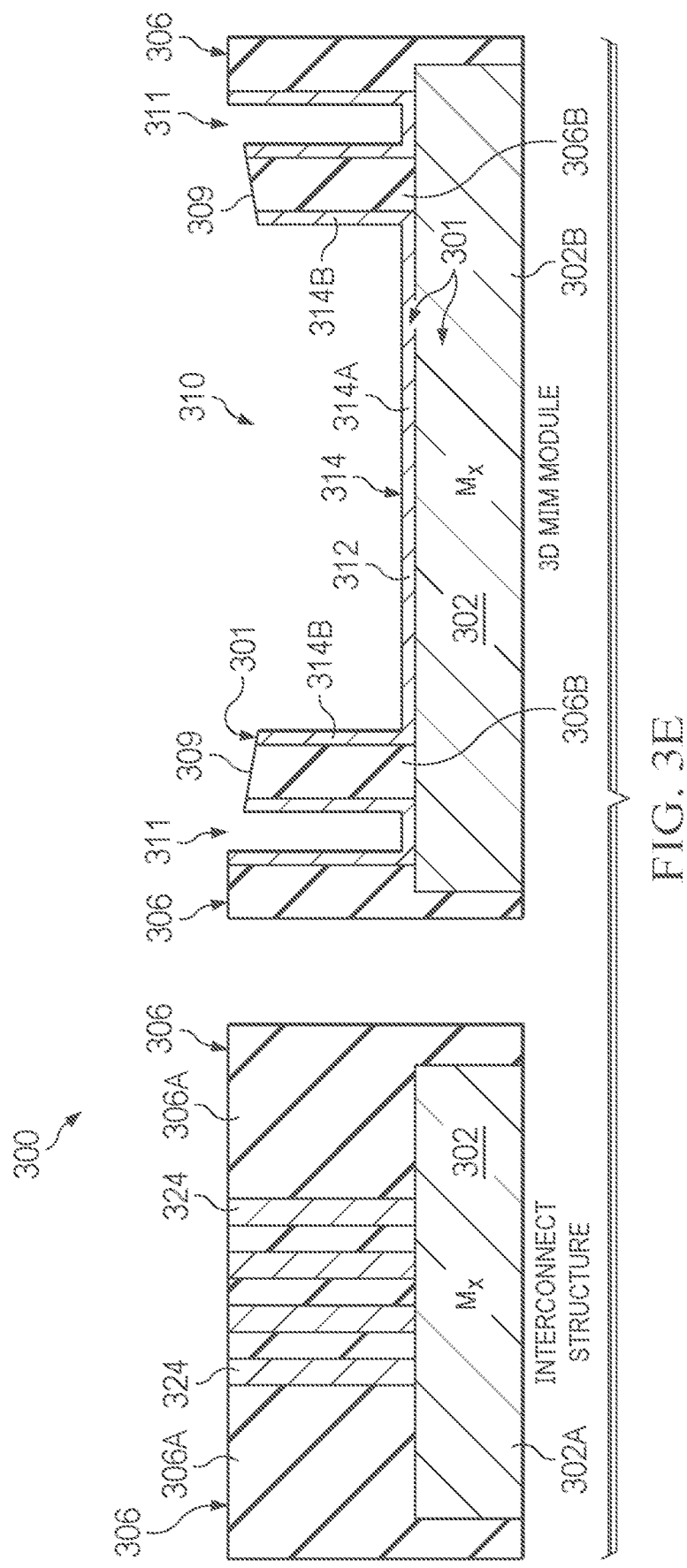
FIG. 3E shows cross-sectional side views of the wafer of FIG. 3D after a first chemical mechanical polishing (CMP) of the wafer.
Figure 3F:
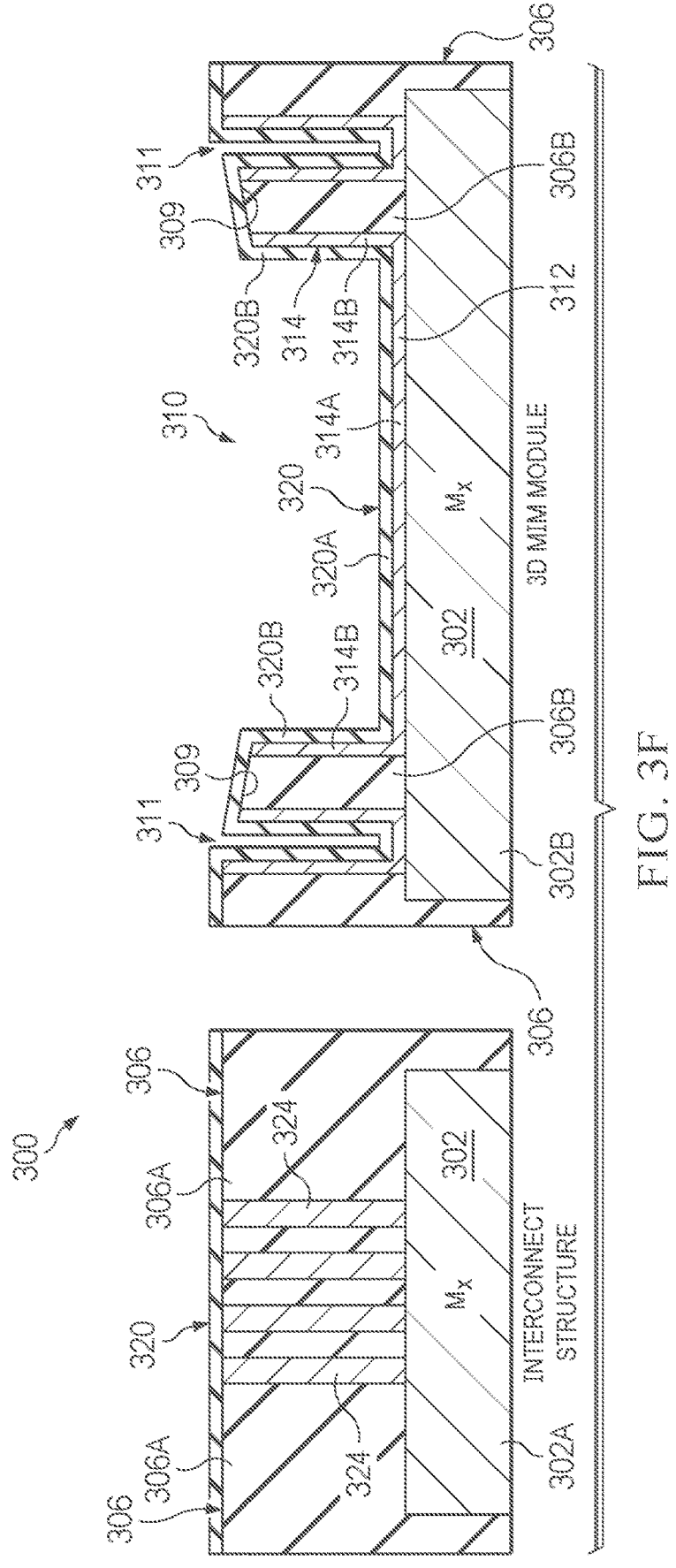
FIG. 3F shows cross-sectional side views of the wafer of FIG. 3E after an insulator has been deposited.
Figure 3G:
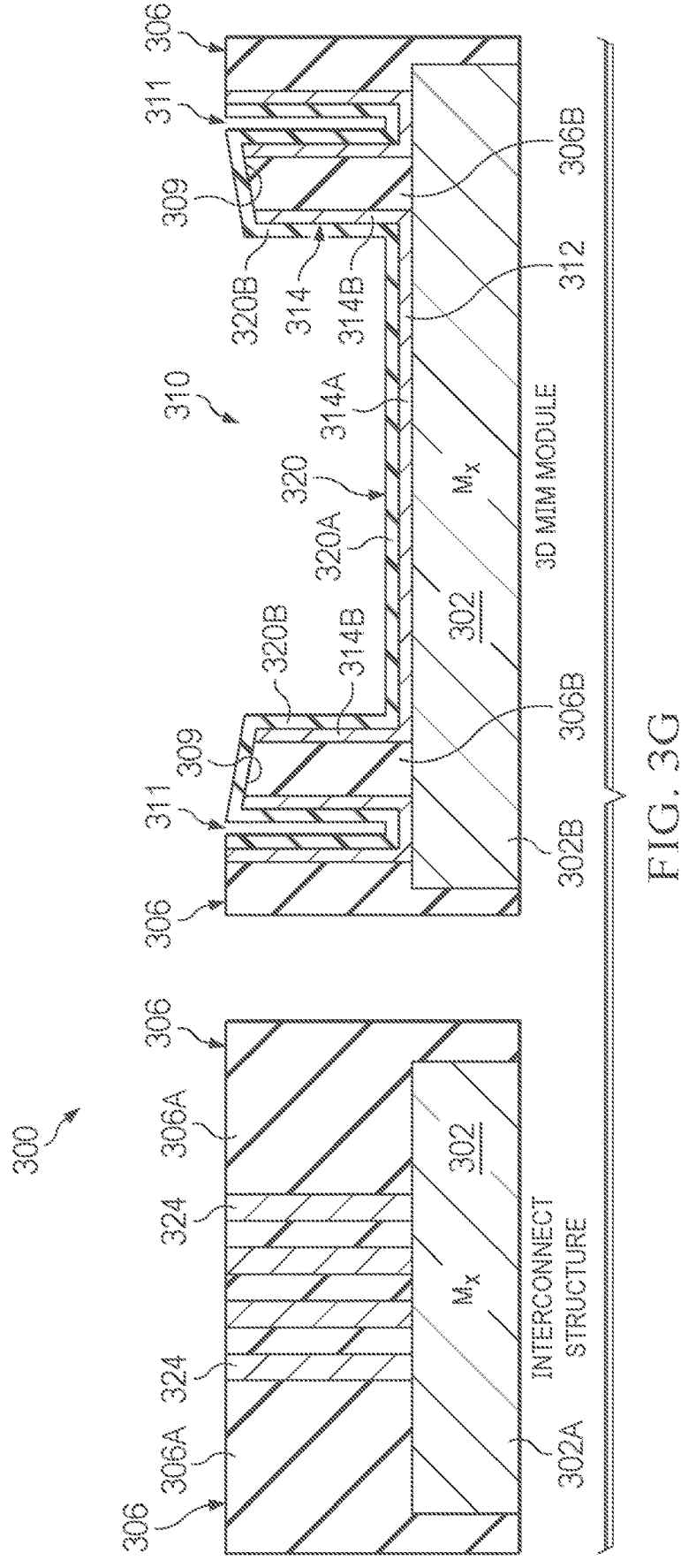
FIG. 3G shows cross-sectional side views of the wafer of FIG. 3F after a second chemical mechanical polishing (CMP) of the wafer.
Figure 3H:
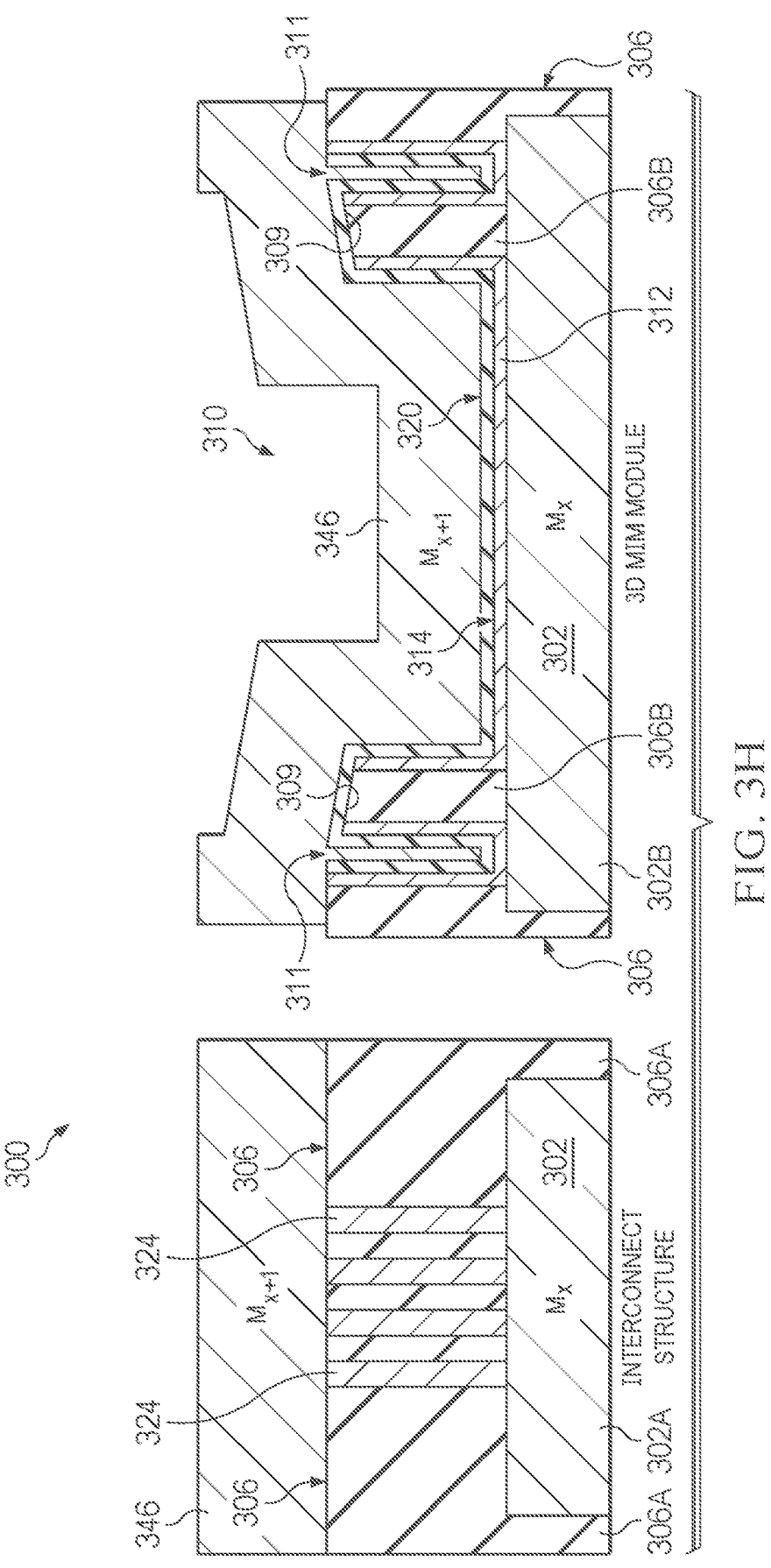
FIG. 3H shows cross-sectional side views of the wafer of FIG. 3G after a Mx+1 metal layer deposition has been formed on the wafer.
Figure 3I:
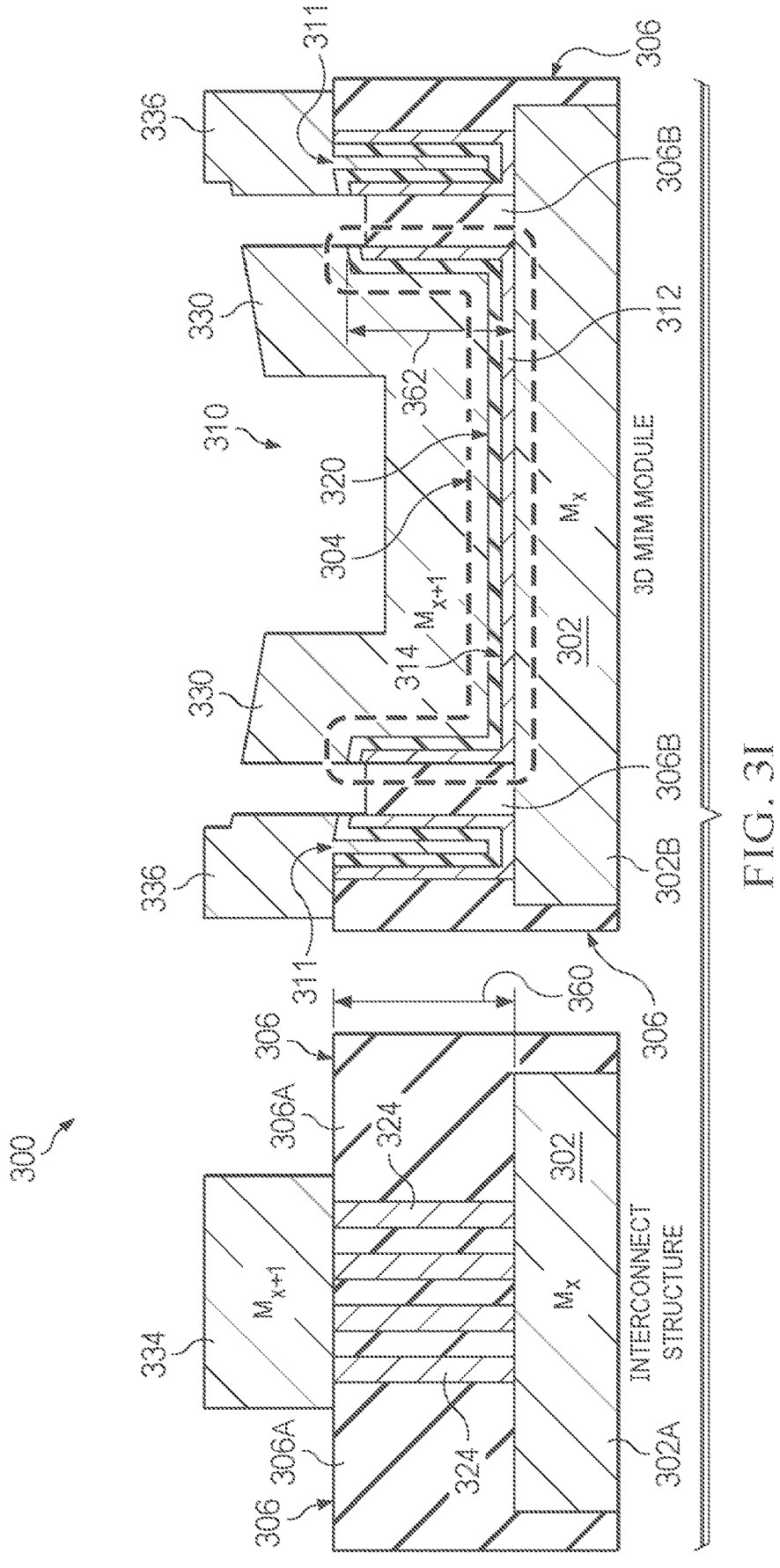
FIG. 3I shows cross-sectional side views of the wafer of FIG. 3H after the Mx+1 metal layer has been patterned and etched.

FIGS. 3A-3I show cross-sectional views illustrating an example process for forming an integrated circuit (IC) device including a 3D MIM capacitor 304 (see FIG. 3I, e.g., similar to the example 3D MIM capacitor 204 shown in FIG. 2). Several of FIGS. 3A-3I show cross-sectional views at two locations of an integrated circuit structure 300 under construction, namely a first location (labelled "Interconnect Structure") at which a first upper layer metal Mx+1 334 (e.g., aluminum bond pad—see FIG. 3I) is connected to an Mx metal layer 302 (e.g., Cu MTOP layer) by one or more via 324 (see FIG. 3I), which is a typical process in the construction of integrated circuits; and a second location (labelled "3D MIM Module") at which the single-layer 3D MIM capacitor 304 is formed (see FIG. 3I), according to one example. According to one aspect, the dishing/erosion from a first chemical mechanical polishing (CMP) removes portions of a conformal layer from a tub lip, which eliminates one mask layer compared to a conventional process, and the dishing/erosion of a second CMP removes portions of an insulator layer outside the 3D MIM capacitor, which eliminates another mask layer compared to a conventional process.

FIG. 3A shows selected portions of a Mx metal layer 302 (e.g., Cu MTOP layer) in the IC structure 300 under construction. A first structure 302A of the Mx metal layer 302 is designated for a typical interconnect structure, while a second structure 302B of the Mx metal layer 302 for a 3D MIM module in which the 3D MIM capacitor 304 (see FIG. 3I) is under construction. The first structure 302A may or may not be contiguous (i.e., electrically connected) to the second structure 302B. Both structures 302A and 302B may be formed over a respective barrier layer (not shown), e.g., a Ta/TaN barrier layer, e.g., by a process including Cu deposition over the barrier layer, followed by a copper CMP (chemical mechanical planarization) process.

After the Mx metal layer 302 is formed, a dielectric layer 306 may be deposited over the Mx metal layer 302. The dielectric layer 306 may include a first dielectric region portion 306A over the first structure 302A, and a second dielectric region portion 306B over the second structure 302B. The dielectric layer 306 may be a combination of multiple layers of dielectric films configured to protect underlying active integrated circuits. For example, the dielectric layer 306 may include the following four layers, deposited in the following order: (1) 0.1 μm Silicon Nitride, (2) 0.1 μm Silicon Rich Oxide (SRO), (3) 0.68 μm Phosphorus Silicate Glass (PSG), and (4) 0.59 μm Silicon oxynitride (SiON).

A photoresist layer (not shown) may be deposited and patterned, followed by at least one etch to define a number of via holes 308, a tub 310 for the 3D MIM capacitor 304 under construction, and one or more trenches 311. The via holes 308, the trenches 311, and tub 310 may be etched concurrently. The shape and dimensions of the tub 310 may be selected based on various parameters, e.g., for effective manufacturing of the 3D MIM capacitor 304 (e.g., effective deposition of the top electrode material (e.g., aluminum) into the wide tub 310) and/or for desired performance characteristics of the resulting 3D MIM capacitor 304. In some embodiments, the tub 310 may be formed with a width $W_{Tub}$ in the range of 1-100 and a vertical height $H_{Tub}$ in the range of 1-10 In some embodiments, the tub 310 has a width in a direction into the page in the range of 1-100 which width may be the same as the illustrated width $W_{Tub}$, e.g., in the case of a square or circular tub 310. The trench 311 width dimension may be in the range of 1 μm-10 μm.

In some embodiments, the tub 310 may be formed with a height-to-width aspect ratio ($H_{Tub}/W_{Tub}$) of less than or equal to 2.0, e.g., to allow effective filling of the tub 310 by conformal materials. For example, the tub 310 may be formed with an aspect ratio $H_{Tub}/W_{Tub}$ in the range of 0.1-2.0, for example in the range of 0.5-2.0. In some embodiments, the tub 310 may be formed with an aspect ratio $H_{Tub}/W_{Tub}$ of less than or equal to 1.5, e.g., for effective filling of the tub 310 by conformal materials. For example, the tub 310 may be formed with an aspect ratio $H_{Tub}/W_{Tub}$ in the range of 0.5-1.5, or more particularly in the range of 0.8-1.2.

In some examples, via holes 308 may be formed with a width $W_{Via}$ in the range of 0.1-0.8 μm. The width $W_{Tub}$ of tub 310 is larger than the width $W_{Via}$ of via holes 308. For example, in some embodiments, the width $W_{Tub}$ of tub 310 is at least twice as large as the with $W_{Via}$ of via holes 308. In particular examples, the width $W_{Tub}$ of tub 310 is at least five times as large as the width $W_{Via}$ of via holes 308, for example the width $W_{Tub}$ of the tub may be between 1 μm and 100 μm. The trench 311 width dimension may be between the width $W_{Via}$ of via hole 308 and the width $W_{Tub}$ of the tub 310, e.g., in the range of 1 μm-10 μm.

FIG. 3B shows a top view of the 3D MIM capacitor 304 (under construction) illustrated in FIG. 3A, wherein the trench 311 is a continuous trench around the perimeter of the tub 310. The trench 311 is in a dielectric layer 306 and is around a perimeter of the tub 310 for the 3D MIM capacitor. A portion of the dielectric layer 306 is between the trench 311 and the tub 310 for the 3D MIM capacitor. A portion of the dielectric layer 306 extends entirely around a perimeter of the tub 310, and the trench 311 extends entirely around a perimeter of the portion of dielectric layer. FIG. 3C shows a top view of an alternative example of the 3D MIM capacitor 304 (under construction) illustrated in FIG. 3A, wherein the trench 311 is a segmented trench comprising a series of separate trenches 311 around the perimeter of the tub 310, for example, four trenches in four directions surrounding the tub 310, but not connected.

As shown in FIGS. 3A-3I, a 3D MIM capacitor 304 may be built concurrently with interconnect structures without the use of an additional mask over that required for the interconnect structures. As shown in FIG. 3A, the interconnect structure starts with patterning and etching steps to form holes 308 in the dielectric layer 306, which is part of a standard process for producing a via. The via holes 308 (small) on the interconnect structure is patterned concurrently with the tub 310 (large size opening, as described above) and the trench 311 (dummy pattern at least partially surrounding the tub 310 to reduce the pattern density) of the 3D MIM module. The via holes 308 are small, 0.1 um-0.5 um, the tub 310 is relatively large, 1 um-100 um, and the trench 311 width dimension is between the critical dimension (CD) of the holes 308 and the CD of the tub 310, e.g., approximately 1 um-10 um. The 3D MIM capacitor 304 may be surrounded by trenches (single or multiple, continuous or segmented) to provide the desired pattern density. A single trench 311 is shown in FIG. 3B, but alternatively, multiple trenches with different widths may be implemented to achieve the desired pattern density variations. Plasma etch may be performed to create the holes 308, the trench 311 (dummy structure), and the tub 310 (3D MIM module) concurrently. The trench 311 may be used to provide a pattern density to create a desired recess of the tub lip 309 to form a capacitor, to be described further. A conformal metal cup in trench 311 also may serve as a bottom electrode connection, besides a normal via (via-x). Conformal metal bottom electrodes may be formed without hillocks. A 3D MIM module may be built between Mx and Mx+1 metal layers, or between silicided poly and M1.

Next, as shown in FIG. 3D, a titanium nitride TiN liner (not shown), or glue layer may be deposited with thickness of about 50 Å-300 Å, followed by a conformal metal 312 (such as tungsten (W)) deposition over the structure 300 such that the conformal metal 312 fills the via holes 308 to form one or more vias 324 and forms a conformal layer over the bottom and sidewall surfaces of the tub 310. Conformal metal 312 is thus in electrical contact with both the first and second structures 302A and 302B, which may be portions of Mx metal layer 302. The conformal metal 312 deposition may be by plasma enhanced chemical vapor deposition (PECVD), such that it is deposited with a substantially uniform thickness on all exposed surfaces. The conformal metal 312 may have a relatively large tensile stress. The deposition thickness of the conformal metal 312 may typically be limited to approximately 5000 Å. If the conformal metal 312 deposition is too thick, it may cause peeling or wafer breakage at subsequent chemical mechanical polishing (CMP) steps. The via hole 308 may be completely filled with conformal metal 312, but the tub 310 and trenches 311 may be partially filled with conformal metal 312.

As shown in FIG. 3E, after a first Chemical Mechanical Polishing (CMP), at a lip of the tub 310, conformal metal 312 is removed due to dishing and some of dielectric layer 306 is removed due to erosion. The first chemical mechanical polishing (CMP) may be performed to remove portions of the conformal metal 312 on the top side of the structure 300, e.g., portions of conformal metal 312 above the vi as 324 and tub 310. The first CMP may also remove at least a portion of the dielectric layer 306 that defines the trench 311, and in particular, may be removed at the tub lip 309. The remaining conformal metal 312 in tub 310 defines a 3D electrode 314 including a bottom portion 314A and sidewall portions 314B extending upwardly from the bottom portion 314A, i.e., extending upwardly from the second interconnect structure 302B. The 3D electrode 314 and the underlying, second interconnect structure 302B (e.g., copper) collectively define a bottom electrode 301 of the 3D capacitor 304 being formed. As indicated above, second structure 302B and bottom portion 314A together form the bottom portion of bottom electrode 301. Due to reduced pattern density around tub 310 (as a result of trench 311), a pad used in the CMP may dish into the tub significantly, removing conformal metal 312 between the tub 310 and the trench 311 (or the lip of the tub), and remove some of dielectric layer 306 (the amount of dielectric layer 306 erosion may be approximately 1500 Å). The erosion of dielectric layer 306 is mainly due to reduced local pattern density, hence increased local pressure at the lip of tub 310. The three-dimensional 3D electrode 314 may be cup-shaped or any other 3D geometry.

Next, as shown in FIG. 3F, an insulator layer 320, e.g., a Silicon Nitride (SiN) layer or other conformal dielectric material, is deposited over the structure 300 and extends down into the tub 310 to cover the 3D electrode 314. A bottom portion 320A of the insulator layer 320 is formed on a surface of the bottom portion 314A of the 3D electrode 314 and sidewall portions 320B of the insulator layer 320 are formed covering the vertically-extending sidewall portions 314B of the 3D electrode 314. The insulator layer 320 defines an insulator layer in the 3D MIM capacitor 304 being formed. The insulator layer 320 may have a substantially uniform thickness between the 3D electrode 314 and a top electrode 330 (see FIG. 3I). The insulator layer 320 may have any suitable thickness, e.g., a thickness in the range of 200-1000 Å, for example, 300-700 Å, for example, 400-600 Å, or about 500 Å. The insulator layer 320 may be Silicon Nitride (SiN), and may be deposited through PECVD (Plasma Enhanced Chemical Vapor Deposition). Alternatively, silicon oxide, or high k dielectrics (with k>7), such as, $Al_2O_3$ (κ~10), $Ta_2O_5$ (κ~25), and $HfO_2$ (κ~22), $ZrO_2$ (κ~35), and others, may be deposited through ALD (Atomic Layer Deposition).

FIG. 3G shows a second chemical mechanical polishing (CMP) of the structure 300. The second CMP may be performed to remove portions of insulator layer 320 outside the tub 310, and expose interconnects 324 in the interconnect structure. The second CMP may be performed with much lower polishing pressure to planarize the wafer with reduced dishing, leaving the insulator layer 320 in the tub lip 309 intact. Due to the erosion discussed above in relation to the first CMP, the second CMP successfully polishes away insulator layer 320 from the rest of the integrated circuit structure without damaging the insulator layer 320 in the tub lip 309. The difference between the first CMP and the second CMP is mainly the down force (polishing pressure) used. The first CMP process may use a high down force (HDF or high pressure), together with patterns of trench 311 to intentionally create dishing and erosion. The polishing pressure may be 3-5 psi (Pounds per Square Inches) or higher for the first CMP process. The second CMP process may use a low down force (LDF, or low pressure) to planarize the surface. The polishing pressure of the second CMP process may be 1-2 psi or lower. The selectivity of slurries used for the first CMP and the second CMP may also be different. The first CMP process may use a high selectivity slurry, which polishes metals at much higher rate than oxide. The second CMP process may use a low selectivity slurry, which polishes metals at a similar rate as dielectrics (insulator layer 320 and dielectric layer 306).

The sidewall portions 314B of the 3D bottom electrode 314 are shortened by dishing/erosion by the first CMP (see FIG. 3E), and as a result the height 362 of the three-dimensional bottom electrode 314 (see FIG. 3I) is lower than the rest of the integrated circuit structure 300. This allows the insulator layer 320 to be removed from the dielectric layer 306 in the interconnect structure during the second CMP (see FIG. 3G) without polishing away the insulator layer 320 from tub lip 309 in the 3D MIM module. Because the three-dimensional bottom electrode 314 is shorter, there is no need to mask the insulator layer 320 in the 3D MIM module during removal of the insulator layer 320 from the interconnect structure.

As shown in FIG. 3H, an Mx+1 metal layer 346 deposition may be formed on the wafer. This Mx+1 metal layer 346 may be part of CMOS interconnect construction. The Mx+1 metal layer 346, e.g., aluminum, may be deposited, so as to extend into the remaining unfilled portion of tub 310 and the trench 311 to cover the insulator layer 320.

Finally, as shown in FIG. 3I, the Mx+1 metal layer 346 may be patterned and etched to define Mx+1 layer pad 334, and a top electrode 330 extending down into the tub 310, thus forming 3D MIM capacitor 304. The three-dimensional bottom electrode 314 has a height 362 that is smaller than a height 360 of the via 324, with the respective heights 360, 362 defined from a common plane at a top surface of Mx metal layer 302. Optional bottom-side pad 336 may also be patterned and etched to be conductively connected to the second interconnect structure 302B through the metal layer 346 filling trench 311. As shown, the second structure 302B (e.g., copper), forming a portion of the bottom electrode 301 may be conductively connected to the top-side pad 334 by the at least one via 324, when first structure 302A is contiguous, i.e. electrically coupled, with second structure 302B. Thus, the top electrode 330 is formed in the Mx+1 metal layer. FIG. 3I shows metal patterning and etching which may be part of the CMOS interconnect construction, as is commonly used. A slight over-etch may allow an etch through the insulator layer 320 in the area between the tub 310 and the trench 311 to avoid shorting. As shown, the MIM capacitor 304 is complete, and ready for the structure 300 to continue to additional CMOS interconnect construction, if any.

Figure 4:
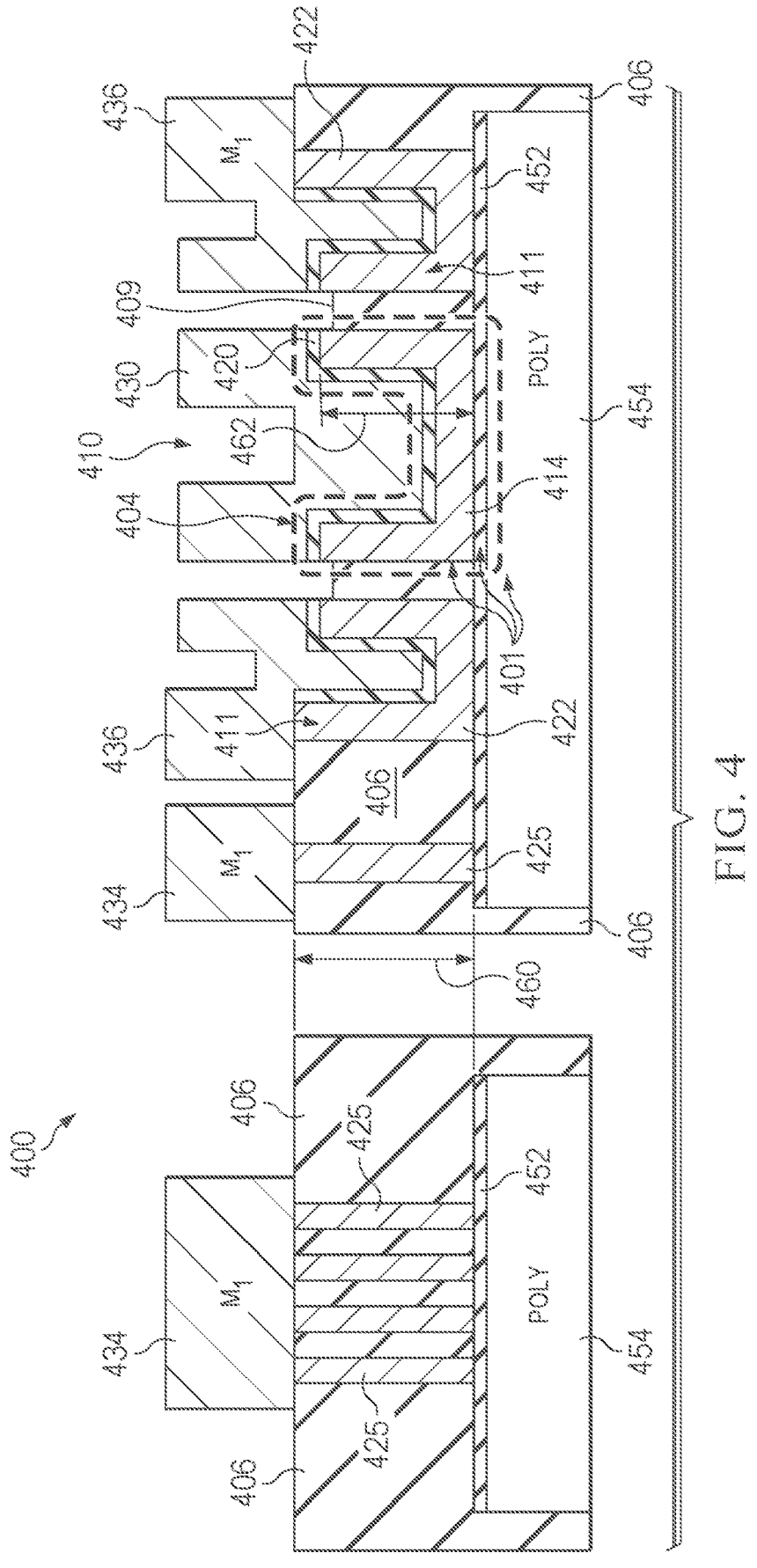
FIG. 4 shows cross-sectional, side views of a MIM capacitor built between a silicided poly layer and a M1 metal layer.

As shown in FIG. 4, in another example the MIM capacitor may be built between silicided poly and metal layer M1. The example 3D MIM capacitor 400 shown in FIG. 4 may have a bottom electrode 401 made of a conformal metal, e.g., tungsten, and may be substantially hillock-free. The example 3D MIM capacitor 400 may have a poly layer 454 and a layer of poly silicide 452. The 3D bottom electrode 414 may be formed in a tub 410 formed in a Poly-Metal Dielectric (PMD) layer 406. The three-dimensional bottom electrode 414 has a height 462 that is smaller than a height 460 of a contact 425, with the respective heights 460, 462 defined from a common plane at a top surface of the layer of poly silicide 452. The 3D bottom electrode 414 may be formed from a conformal metal, such as tungsten (W) or other suitable material, e.g., formed from the same material and concurrently with contact(s) 425. 3D bottom electrode 414 is electrically coupled with the layer of poly silicide 452. An insulator layer 420 may be a conformal layer, formed from SiN or other suitable dielectric material. A top electrode 430 is formed over the insulator layer 420. The bottom electrode 401 (poly layer 454, poly silicide 452, and 3D bottom electrode 414) may also be conductively connected to a top-side bond pad 434, e.g., by at least one contact 425 connecting the metal-1 layer pad 434 to the poly silicide 452, in an example where the various poly layers 454 are formed contiguously, or connected. A conformal metal cup in trenches 411 may also optionally serve to form trench connections 422, which provide optional additional electrode connection with the layer of poly silicide 452, besides 1 contacts 425 and may be electrically coupled to an optional bottom-side connection pad 436. Chemical mechanical polishing (CMP) may produce a 3D MIM capacitor having a three-dimensional bottom electrode 414 that has a height 462 that is smaller than a height 460 of a contact 425. By varying CMP parameters, desired capacitor heights may be obtained. More or less of the dielectric layer 406 at the tub lip 409 may be removed. For example, the CMP parameters may be adjusted to remove by erosion about 1500 Å of material from the dielectric layer 406 at the tub lip 409. The difference between the height 462 of the 3D bottom electrode 414 and the height of the contact 425 is between about 0.1 μm and about 0.5 μm. As illustrated in FIG. 4, the height of the contact 425 is the same as the height of a trench connection 422.

Figure 5:
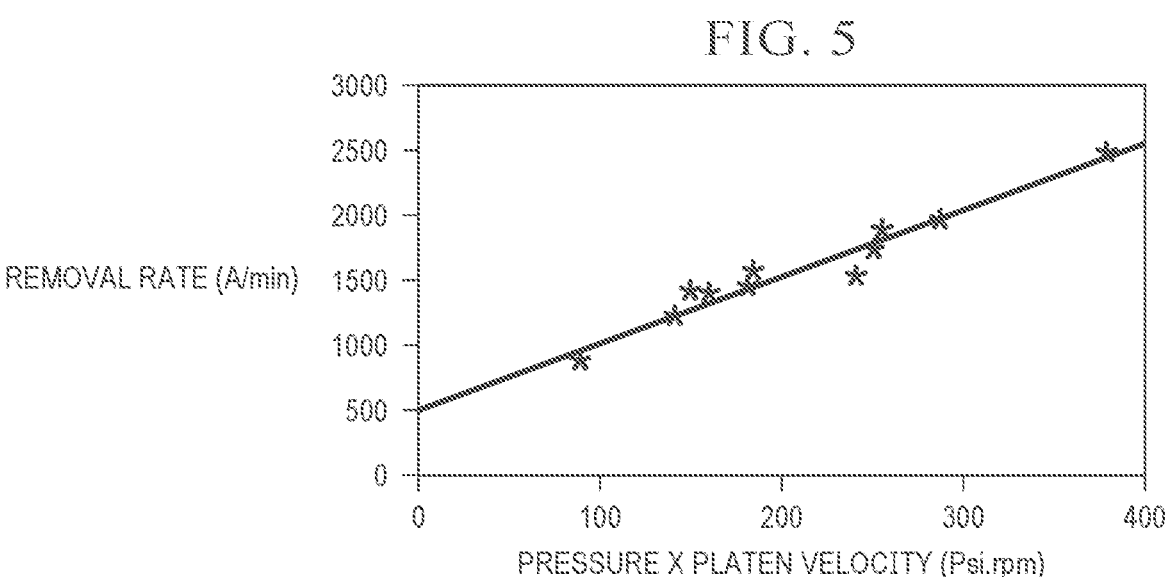
FIG. 5 shows how the Preston Equation may explain the removal rate of the conformal metal.

As shown in FIG. 5, the Preston Equation may explain the use of trench 311 to engineer the local pattern density variation to achieve desired dishing and erosion from the CMP processes. The removal rate of the chemical mechanical polishing (CMP) may be proportional to the down force and velocity.

$$RR=K_P*P*V$$

Where
   RR=Removal Rate

Figure 6A:
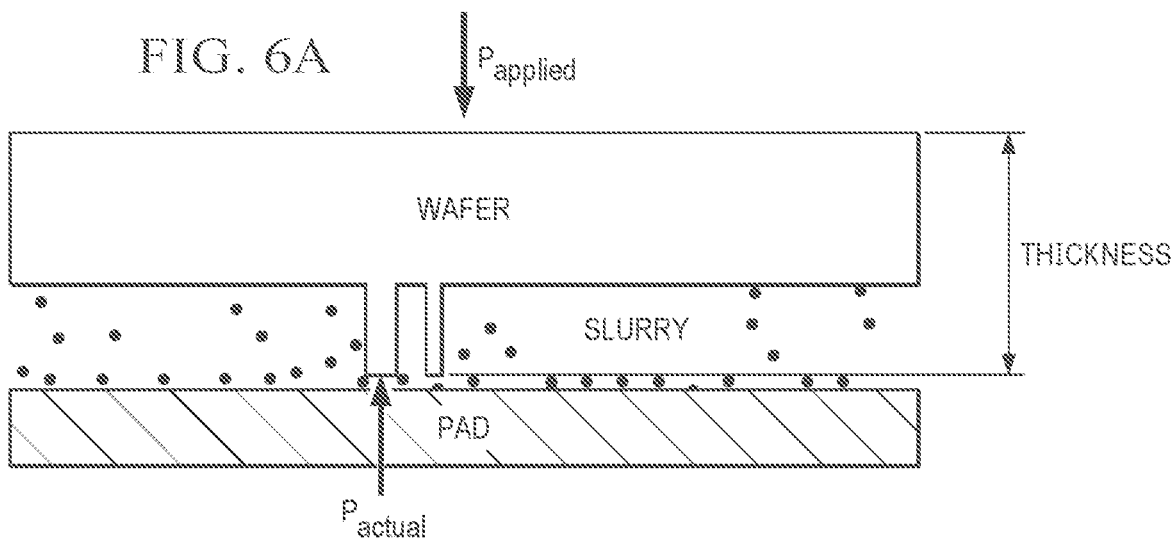
FIGS. 6A-6C show the implications of the Preston Equation, wherein the removal rate may be dependent on the pattern density.
Figure 6B:
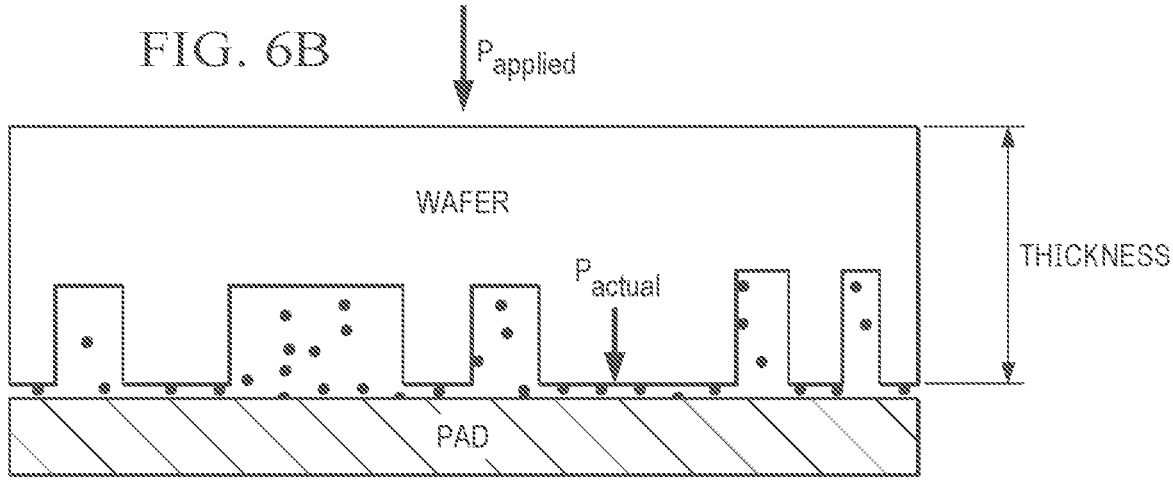
Figure 6C:
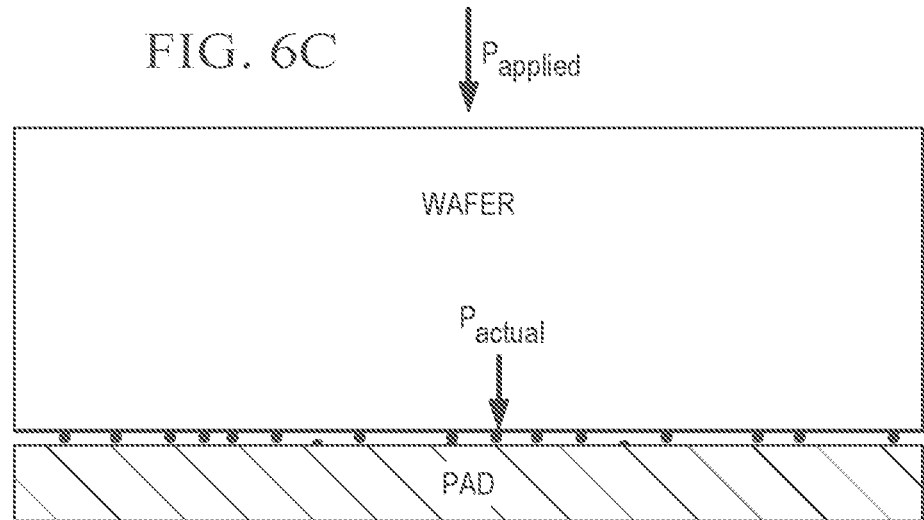

Kr=Preston Coefficient
P=Applied Pressure
V=Linear Velocity
FIGS. 6A-6C show the implications of the Preston Equation, wherein the local removal rate may be dependent on the local pattern density. By engineering the local pattern density, the amount of desired dishing and erosion at the cup lip may be achieved. A difference in pattern density may lead to a difference in polishing rate to produce different dishing and erosion. FIG. 6A shows a wafer with 10% pattern density ($P_{actual}=10*P_{applied}$). The removal rate at 10% pattern density may equal ten times the blanket remove rate, since the actual applied pressure is 10 times the applied pressure, since it is applied ultimately to only 10% of the wafer surface area, although the total material removed may be similar. FIG. 6B shows a wafer with 50% pattern density ($P_{actual}=2*P_{applied}$). The removal rate at 50% pattern density may equal two times the blanket removal rate, although the total material removed may be similar. FIG. 6C shows a wafer with no pattern ($P_{actual}=P_{applied}$), such that the wafer is already planarized.

Figure 7:
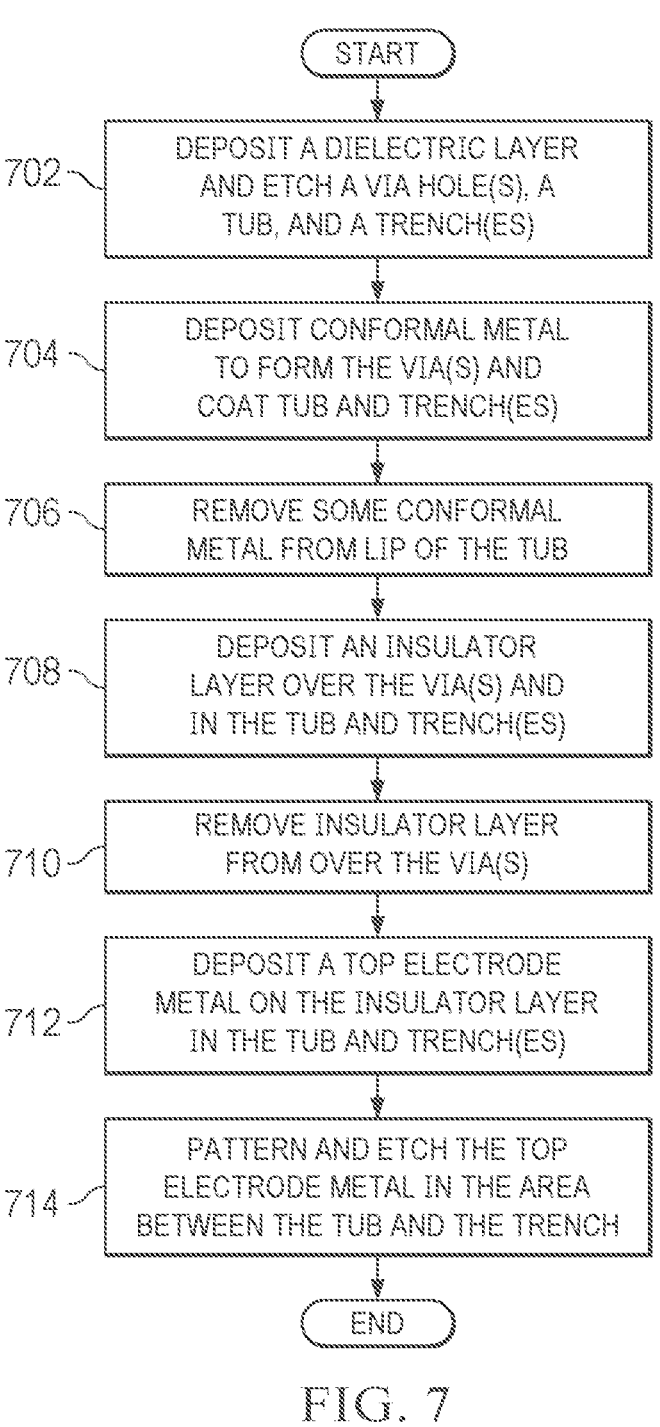
FIG. 7 shows a flow chart for a method of building a three-dimensional MIM capacitor.

FIG. 7 shows a method for building a 3D MIM capacitor. A dielectric layer is deposited and etched 702 to make via hole(s), a tub, and trench(es). See FIG. 3A. Conformal metal is deposited 704 to form via(s) and coat the walls and bottom of the tub and the trench(es). See FIG. 3D. Some conformal metal is removed 706 from lip of the tub. See FIG. 3E. An insulator layer is deposited 708 over the via(s) and in the tub and trench(es) coating the conformal metal. See FIG. 3F. The insulator layer is removed 710 from over the via(s). See FIG. 3G. A top electrode metal is deposited 712 on the insulator layer in the tub and trench(es). See FIG. 3H. The top electrode metal is patterned and etched 714 in the area between the tub and the trench. See FIG. 3I.

Figure 8:
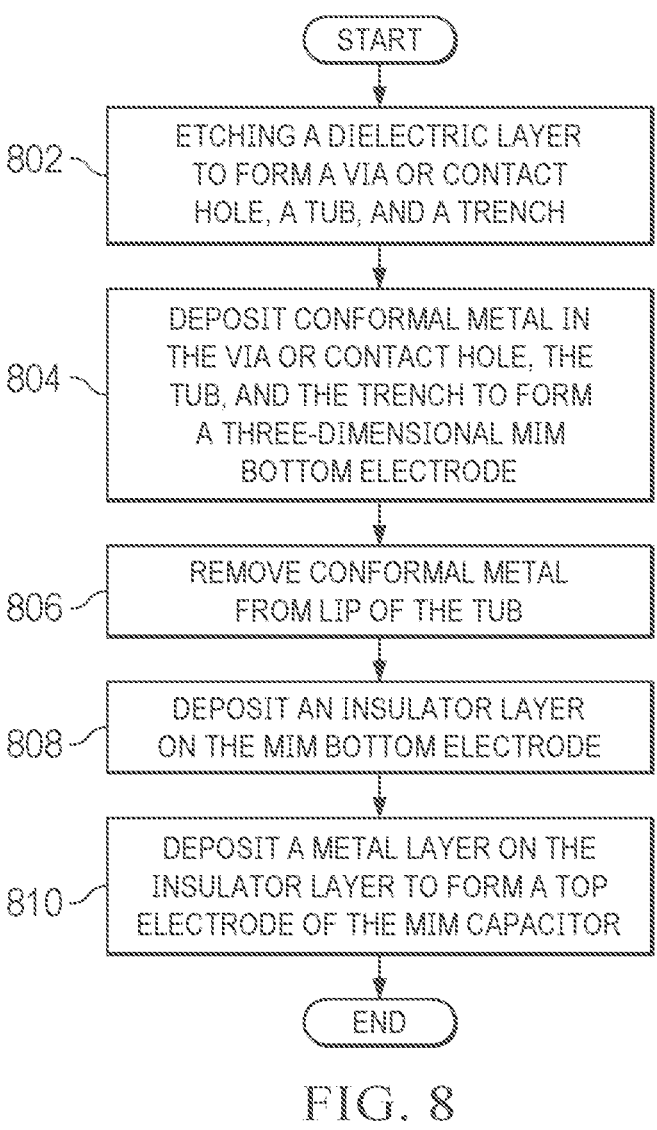
FIG. 8 shows a flow chart for a method of building a three-dimensional MIM capacitor.

FIG. 8 shows a method for building a 3D MIM capacitor. A dielectric layer is etched 802 to form a via or contact hole, a tub, and a trench. A conformal metal is deposited 804 in the via or contact hole, the tub, and the trench to form a three-dimensional conductor. Conformal metal is removed 806 from the lip of the tub. An insulator layer is deposited 808 on the three-dimensional electrode. A metal layer is deposited 810 on the insulator layer to form a top electrode of the MIM capacitor.

Although examples have been described above, other variations and examples may be made from this disclosure without departing from the spirit and scope of these disclosed examples.

The invention claimed is:
1. A device comprising:
   a three-dimensional metal-insulator-metal (MIM) capacitor comprising:
      a three-dimensional bottom electrode in a dielectric layer;
      a top electrode; and
      an insulator layer between the top electrode and the three-dimensional bottom electrode;
   a trench in the dielectric layer around a perimeter of the three-dimensional MIM capacitor;
   a Mx metal layer or silicided poly layer electrically connected to the three-dimensional bottom electrode;
   an Mx+1 metal layer or M1 metal layer comprising the top electrode; and
   a metal pad electrically connected to the Mx metal layer or silicided poly layer through a via or contact, respectively,
   wherein a height of the three-dimensional bottom electrode is smaller than a height of the via or contact.

2. The device of claim 1, wherein a difference between the height of the three-dimensional bottom electrode and the height of the via or contact is between about 0.1 μm and about 0.5 μm.

3. The device of claim 1, wherein the insulator layer has a substantially uniform thickness between the three-dimensional bottom electrode and the top electrode.

4. The device of claim 1, comprising a portion of the dielectric layer between the trench and the three-dimensional MIM capacitor.

5. The device of claim 4, wherein the portion of the dielectric layer extends entirely around a perimeter of the three-dimensional MIM capacitor, and wherein the trench extends entirely around a perimeter of the portion of the dielectric layer.

6. The device of claim 1, wherein the Mx metal layer or silicided poly layer comprises a metal.

7. The device of claim 1, wherein the Mx metal layer or silicided poly layer comprises a silicided poly layer.

8. The device of claim 1, wherein the three-dimensional bottom electrode comprises tungsten.

9. The device of claim 1, wherein the via or contact comprises tungsten.

10. A device comprising:
a three-dimensional metal-insulator-metal (MIM) capacitor comprising:
    a three-dimensional bottom electrode in a dielectric layer;
    a top electrode; and
    an insulator layer between the top electrode and the three-dimensional bottom electrode;
a trench in the dielectric layer around a perimeter of the three-dimensional MIM capacitor
an Mx metal layer or silicided poly layer electrically connected to the three-dimensional bottom electrode;
an Mx+1 metal layer or M1 metal layer comprising the top electrode; and
a metal pad electrically connected to the Mx metal layer or silicided poly layer through a trench connection, respectively,
wherein a height of the three-dimensional bottom electrode is smaller than a height of the trench connection.

11. A device comprising:
a three-dimensional metal-insulator-metal (MIM) capacitor in a dielectric layer, the MIM capacitor comprising:
    a tub-shaped bottom electrode in a dielectric layer;
    a top electrode; and
    an insulator layer between the top electrode and the tub-shaped bottom electrode;
a trench in the dielectric layer around a perimeter of the three-dimensional MIM capacitor;
a Mx metal layer or silicided poly layer electrically connected to the tub-shaped bottom electrode; and
an Mx+1 metal layer or M1 metal layer comprising the top electrode,
wherein a height of the tub-shaped bottom electrode is smaller than a height of the dielectric layer.

12. The device of claim 11, wherein a difference between the height of the tub-shaped bottom electrode and the height of the dielectric layer is between about 0.1 μm and about 0.5 μm.

13. The device of claim 11, wherein the insulator layer has a substantially uniform thickness between the tub-shaped bottom electrode and the top electrode.

14. The device of claim 11, comprising a portion of the dielectric layer between the trench and the three-dimensional MIM capacitor.

15. The device of claim 14, wherein the portion of the dielectric layer extends entirely around a perimeter of the three-dimensional MIM capacitor, and wherein the trench extends entirely around a perimeter of the portion of the dielectric layer.

16. The device of claim 11, wherein the Mx metal layer or silicided poly layer comprises a metal or a silicided poly layer.

17. The device of claim 11, wherein the tub-shaped bottom electrode comprises tungsten.

18. The device of claim 1, wherein the trench is a segmented trench.

19. The device of claim 11, wherein the trench is a segmented trench.

20. The device of claim 10, wherein the trench is a segmented trench.

* * * * *